US012684846B2

(12) United States Patent
 Narita

(10) Patent No.: US 12,684,846 B2
(45) Date of Patent: Jul. 14, 2026

(54) MULTILAYERED SUBSTRATE

(71) Applicant: SUMITOMO CHEMICAL COMPANY, LIMITED, Tokyo (JP)

(72) Inventor: Yoshinobu Narita, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 344 days.

(21) Appl. No.: 18/617,821

(22) Filed: Mar. 27, 2024

(65) Prior Publication Data

US 2024/0339504 A1 Oct. 10, 2024

(30) Foreign Application Priority Data

Apr. 6, 2023 (JP) ................................. 2023-062140

(51) Int. Cl.
 *H10D 62/85* (2025.01)
 *C30B 25/20* (2006.01)
 *C30B 29/40* (2006.01)

(52) U.S. Cl.
 CPC ......... *H10D 62/8503* (2025.01); *C30B 25/20* (2013.01); *C30B 29/406* (2013.01)

(58) Field of Classification Search
 CPC ....... C30B 25/18; C30B 25/20; C30B 29/406; H10D 62/8503
 See application file for complete search history.

(56) References Cited

U.S. PATENT DOCUMENTS

2020/0208297 A1 7/2020 Horikiri et al.
2024/0339492 A1* 10/2024 Narita .................... H10D 62/10

FOREIGN PATENT DOCUMENTS

JP 2018-199601 A 12/2018

* cited by examiner

*Primary Examiner* — Matthew L Reames
(74) *Attorney, Agent, or Firm* — Birch, Stewart, Kolasch & Birch, LLP

(57) ABSTRACT

A multilayered substrate comprises: an underlying substrate; and a gallium nitride layer epitaxially grown above the underlying substrate and comprising gallium nitride doped with silicon; the gallium nitride layer having a top surface with a radius of 50 mm or more, the gallium nitride layer having a thickness of 4 μm or more, wherein a silicon concentration in the top surface of the gallium nitride layer has a distribution in which an outer circumferential silicon concentration at a radial position 10 mm from an edge of the top surface is higher than a central silicon concentration at a center of the top surface, the central silicon concentration is $4\times10^{15}$ cm$^{-3}$ or more and less than $2\times10^{16}$ cm$^{-3}$, and a carbon concentration in the top surface of the gallium nitride layer has a distribution in which an outer circumferential carbon concentration at a radial position 10 mm from an edge of the top surface is higher than a central carbon concentration at a center of the top surface.

5 Claims, 4 Drawing Sheets

MULTILAYERED SUBSTRATE

TECHNICAL FIELD

The present invention relates to a multilayered substrate.

DESCRIPTION OF RELATED ART

A multilayered substrate, in which a gallium nitride (GaN) layer is epitaxially grown on various underlying substrates, is used as a material for manufacturing a semiconductor device (for example, see Patent Literature 1). In order to improve production efficiency of the semiconductor device, a diameter of the multilayered substrate is being increased. Silicon (Si) is used as an n-type impurity added to a GaN layer.

As detailed later, when considering the multilayered substrate with a large diameter, a low doped Si concentration, and a thick GaN layer, the inventor of the present application found that in-plane non-uniformity (specifically, non-uniformity in which the Si concentration increases on the outer circumferential side of the GaN layer) is likely to occur in a Si concentration distribution in the GaN layer.

Patent Literature 1: Japanese Patent Application Publication No. 2018-199601

SUMMARY OF THE INVENTION

One object of the present invention is to provide a multilayered substrate in which in-plane non-uniformity of a n-type carrier concentration resulting from in-plane non-uniformity of a Si concentration distribution in a GaN layer is suppressed.

According to one aspect of the present invention, there is provided a multilayered substrate, including:

an underlying substrate; and a gallium nitride layer epitaxially grown above the underlying substrate and comprising gallium nitride doped with silicon;

the gallium nitride layer having a top surface with a radius of 50 mm or more, the gallium nitride layer having a thickness of 4 m or more, wherein a silicon concentration in the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and a carbon concentration in the top surface of the gallium nitride layer has a distribution in which an outer circumferential carbon concentration at a radial position 10 mm from an edge of the top surface is higher than a central carbon concentration at a center of the top surface.

There is provided a multilayered substrate in which in-plane non-uniformity of an n-type carrier concentration due to an in-plane non-uniformity of a Si concentration distribution in a GaN layer, is suppressed.

DETAILED DESCRIPTION OF THE INVENTION

Figure 1:
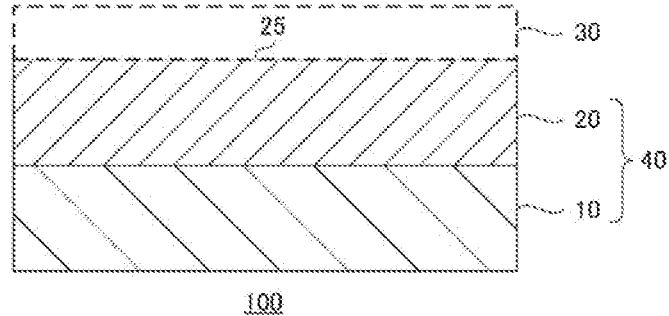
FIG. 1 is a schematic cross-sectional view illustrating a multilayered substrate according to an embodiment.

A multilayered substrate 100 according to an embodiment of the present invention will be described. FIG. 1 is a schematic cross-sectional view illustrating the multilayered substrate 100. The multilayered substrate 100 includes at least an underlying structure 10 and a gallium nitride (GaN) layer 20 formed on the underlying structure 10.

The underlying structure 10 has at least an underlying substrate that is a crystal substrate on which the GaN layer 20 is epitaxially grown. The underlying structure 10 may have a buffer layer between the underlying substrate and the GaN layer 20, if necessary. The structure of the buffer layer may be appropriately selected as appropriate.

As the underlying substrate, a GaN substrate, a sapphire substrate, a silicon (Si) substrate, a silicon carbide (SiC) substrate, etc., may be used as appropriate. For example, when the underlying substrate is a GaN substrate, the underlying structure 10 may be a GaN substrate. Further, for example, when the underlying substrate is a Si substrate, the underlying structure 10 may include a Si substrate, an aluminum nitride (AlN) layer provided as a nucleation layer, and the like.

The multilayered substrate 100 may have an upper layer 30 formed on the GaN layer 20, if necessary. The structure of the upper layer 30 may be selected as appropriate depending on an operation of a semiconductor device desired to be manufactured using the multilayered substrate 100. The upper layer 30 may be, for example, a III-nitride layer epitaxially grown on the GaN layer 20.

The GaN layer 20 according to an embodiment has characteristics as described below. The GaN layer 20 has a top surface 25 with a radius of 50 mm or more (diameter of 100 mm or more). That is, the multilayered substrate 100 has a circular shape with a diameter of 100 mm or more. The multilayered substrate 100 may have an orientation flat or a notch if necessary.

The GaN layer 20 contains silicon (Si) as an n-type impurity. The Si concentration in the top surface 25 of the GaN layer 20 has a distribution in which an outer circumferential Si concentration CSi1 at the outer circumference of the top surface 25 is higher than a central Si concentration CSi0 at the center of the top surface 25.

The central Si concentration CSi0 is a low concentration that is affected by a concentration fluctuation of $10^{15}$ cm$^{-3}$ order, and specifically is $4 \times 10^{15}$ cm$^{-3}$ or more and less than $2 \times 10^{16}$ cm$^{-3}$. Such an effect is more significant in an embodiment where the central Si concentration CSi0 is less than $1 \times 10^{16}$ cm$^{-3}$ (that is, $10^{15}$ cm$^{-3}$ order). The thickness of the GaN layer 20 is 4 m or more. Further, the thickness of the GaN layer 20 is, for example, 40 m or less.

The GaN layer 20 is a layer that functions as at least a part of an active layer in a semiconductor device including the multilayered substrate 100. Therefore, it is preferable that the GaN layer 20 has both breakdown voltage property and resistance property in a well-balanced manner. From a viewpoint of improving the breakdown voltage, the central Si concentration CSi0 of the GaN layer 20 is preferably less than $2 \times 10^{16}$ cm$^{-3}$. Also, from the viewpoint of improving the breakdown voltage, the thickness of the GaN layer 20 is preferably 4 μm or more. From a viewpoint of reducing resistance, the central Si concentration CSi0 of the GaN layer 20 is preferably $4 \times 10^{15}$ cm$^{-3}$ or more. Also, from the viewpoint of reducing resistance, the thickness of the GaN layer 20 is preferably 40 μm or less.

As detailed later, the outer circumferential Si contamination concentration that is an excess of the outer circumferential Si concentration CSi1 from the central Si concentration CSi0 (i.e., CSi1−CSi0) is the concentration of Si mixed into the outer circumference of the GaN layer 20 resulting from a Si-containing deposition 230. The central Si concentration CSi0 is approximately equal to a target Si doping concentration, which is an intentionally added Si concentration.

Due to the mixture of Si, the n-type carrier concentration in the outer circumference exceeds that at the center. The GaN layer 20 contains carbon (C) as an impurity that compensates for the excess n-type carrier concentration in the outer circumference. The C concentration in the top surface 25 of the GaN layer 20 has a distribution in which the outer circumferential C concentration CC1 in the outer circumference of the top surface 25 is higher than the central C concentration CC0 at the center of the top surface 25. An outer circumferential C-doping concentration (ie, CC1−CC0) is the concentration of C added to compensate for the excess n-type carrier concentration in the outer circumference.

The following description shows an embodiment in which the radius of the GaN layer 20 is 50 mm, the thickness of the GaN layer 20 is 4 m, and the target Si doping concentration in the GaN layer 20 is $9 \times 10^{15}$ cm$^{-3}$. Such conditions are common to the embodiment and the comparative embodiment.

Figure 2:
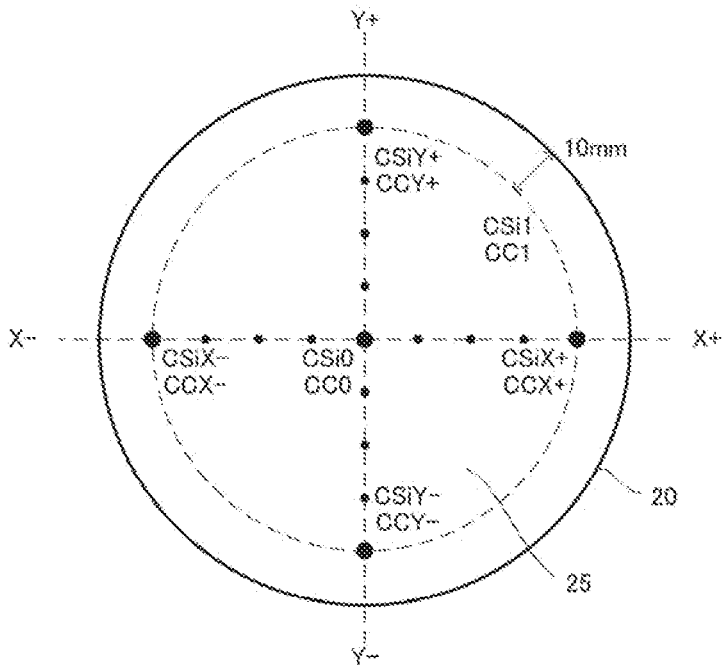
FIG. 2 is a top view of a GaN layer for explaining how to measure a Si concentration and a C concentration in the GaN layer.

A method of measuring the Si concentration and C concentration in the GaN layer 20 will be explained. Hereinafter, for a content common to the Si concentration and the C concentration, the expression "concentration" may be simply used to avoid complication of explanation. FIG. 2 is a top view of the GaN layer 20 for explaining how to measure the Si concentration in the GaN layer 20. An XY orthogonal coordinate system is set on the top surface 25 of the GaN layer 20, with a center of the top surface 25 as an origin.

First, an in-plane measurement position will be explained. At least five measurement points: a center measurement point and four outer circumferential measurement points are set as measurement points for concentration in the top surface 25. The center measurement point is set at the center of the top surface 25. The four outer circumferential measurement points are set at radial positions of 10 mm from the edge of the top surface 25 in each of the X positive direction, X negative direction, Y positive direction, and Y negative direction (that is, every 900 in the circumferential direction). Here, when defining the concentration in the outer circumference of the top surface 25, a radial position of 10 mm from the edge of the top surface 25 is set as a representative position at the outer circumference.

The Si concentration at the center measurement point is the central Si concentration CSi0. The Si concentration that is an average of the Si concentration CSiX+ at the outer circumferential measurement point in the positive X direction, the Si concentration CSiX− at the outer circumferential measurement point in the negative X direction, the Si concentration CSiY+ at the outer circumferential measurement point in the Y positive direction, and the Si concentration C SiY− at the outer circumferential measurement point in the negative Y direction, is the outer circumferential Si concentration CSi1. That is, the outer circumferential Si concentration CSi1 indicates the Si concentration averaged in the circumferential direction of the outer circumference. The excess of the outer circumference Si concentration CSi1 from the central Si concentration CSi0, ie, CSi1−CSi0, is the outer circumferential Si contamination concentration.

The C concentration at the center measurement point is the central C concentration CC0. The C concentration obtained by averaging the C concentration CCX+ at the outer circumference measurement point in the X positive direction, the C concentration CCX− at the outer circumference measurement point in the X negative direction, the C concentration CCY+ at the outer circumferential measurement point in the Y positive direction and the C concentration CCY− at the outer circumference measurement point in the Y negative direction, is the outer circumferential C concentration CC1. That is, the outer circumferential C concentration CC1 indicates the C concentration averaged in the circumferential direction of the outer circumference. The excess of the outer circumferential C concentration CC1 from the central C concentration CC0, ie, CC1−CC0, is the outer circumferential C-doping concentration.

In this example, the radius of the top surface 25 is 50 mm. The four outer circumferential measurement points are set at radial positions of 40 mm from the center in each of the X positive direction, the X negative direction, the Y positive direction, and the Y negative direction.

In addition to the central measurement point and the four outer circumferential measurement points, an intermediate measurement point may be set at a radial position intermediate between the central measurement point and the outer circumferential measurement point. In this example, intermediate measurement points are set at radial positions 10 mm, 20 mm, and 30 mm from the center in the X positive direction, the X negative direction, the Y positive direction, and the Y negative direction, respectively. In FIG. 2, for ease of illustration, the central measurement point and the outer circumferential measurement points are shown as large black circles, and the intermediate measurement points are shown as small black circles.

Also in the embodiment in which the radius of the top surface 25 of the GaN layer 20 is more than 50 mm, the four outer circumferential measurement points are set at radial positions 10 mm from the edge of the top surface 25. Also in the embodiment in which the radius of the top surface 25 of the GaN layer 20 is more than 50 mm, the intermediate measurement points may be set at radial positions every 10 mm from the center in each of the X positive direction, the X negative direction, the Y positive direction, and the Y negative direction.

The concentration, which is the average of the concentrations at four measurement points in the X positive direction, the X negative direction, the Y positive direction, and the Y negative direction, which are set at equal radial positions from the center of the top surface 25, that is, the concentrations averaged in the circumferential direction for each radial position are referred to as average Si concentration and average C concentration for Si and C, respectively. The outer circumferential Si concentration CSi1 and the outer circumferential C concentration CC1 are the average Si concentration and the average C concentration in the outer circumference, respectively.

As will be described later, the growth of the GaN layer 20 is performed so as to be uniform in the circumferential direction. However, actually, variation in the concentration occurs even among the four measurement points set at equal radial positions. In order to reduce the effect of such a variation, the radial distribution of the concentration in the GaN layer 20 is evaluated for each of Si and C using the average Si concentration, which is the Si concentration averaged in the circumferential direction, and the average C concentration, which is the C concentration averaged in the circumferential direction. The concentration of the mixed Si is the excess of the average Si concentration from the central Si concentration CSi0 at each position in the radial direction. The concentration of added C is the excess of the average C concentration from the central C concentration CC0 at each radial position.

When specifying that "the outer circumferential Si concentration CSi1 is higher than the central Si concentration CSi0", it is so specified that not only satisfying the condition that the outer circumferential Si concentration CSi1, that is, the average value of the Si concentrations at the four outer circumference measurement points is higher than the central Si concentration CSi0, but also satisfying the condition that the Si concentration at at least three (preferably four) of the four circumferential measurement points is higher than the central Si concentration CSi0.

Further, when specifying that "the outer circumferential C concentration CC1 is higher than the center C concentration CC0", it is so defined that not only satisfying the condition that the outer circumferential C concentration CC1, that is, the average value of the C concentration at the four outer circumference measurement points, is higher than the central C concentration CC0, but also satisfying the condition that the C concentration at at least three (preferably four) of the four outer circumference measurement points is higher than the central C concentration CC0.

Next, the measurement position in a height direction will be explained. As the concentration in the GaN layer 20 (Si concentration and C concentration, respectively), the concentration in the top surface 25 is measured by secondary ion mass spectrometry (SIMS). However, the "concentration in the top surface 25" does not mean the concentration exactly at the height of the top surface 25, but means the concentration near the top surface 25, as explained below. The top surface 25 is the uppermost surface of the multilayered substrate 100 in an embodiment in which the upper layer 30 is not laminated, and an interface between the upper layer 30 and the GaN layer 20 in an embodiment in which the upper layer 30 is laminated.

In general, SIMS measurement at a surface location is not reliable. Therefore, it is preferable to perform the SIMS measurement at a height slightly on the side of the underlying structure 10 from the top surface 25, that is, slightly on the inside of the GaN layer 20. Further, it is preferable to use a measured value averaged over a certain height range (depth range, thickness range). Here, for each in-plane measurement point, an average value of SIMS measurement values in a depth range of 100 nm or more and 200 nm or less from the top surface 25 is defined as the concentration in the top surface 25. For example, in an embodiment in which the thickness of the GaN layer 20 is 4 μm, the average value of the concentration measured by SIMS in a height range of 3.8 μm or more and 3.9 μm or less from the lower surface of the GaN layer 20 is defined as the concentration in the top surface 25.

The concentration at an intermediate height between the top surface 25 of the GaN layer 20 and the bottom surface of the GaN layer 20 (the concentration at a predetermined depth position from the top surface 25 of the GaN layer 20) is defined according to the concentration in the upper surface 25. Specifically, the average value of SIMS measurement values in a depth range of 100 nm or more and 200 nm or less from a predetermined depth position is defined as the concentration at the predetermined depth position.

Figure 7:
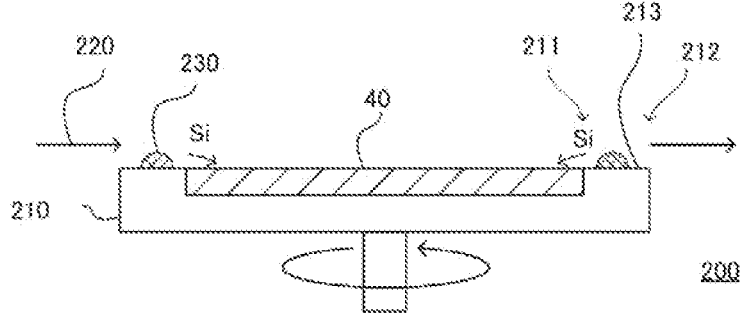
FIG. 7 is a graph schematically showing the Si concentration distribution according to the second example, similar to FIG. 6.

Before further describing the embodiment, a comparative embodiment will be described. FIG. 7 is a schematic side view illustrating an apparatus 200 for manufacturing the GaN layer 20 according to a comparative embodiment. The manufacturing apparatus 200 is a metal organic vapor phase epitaxy (MOVPE) apparatus including a susceptor 210 on which a wafer 40 is placed. The wafer 40 is an object to be processed (an intermediate body of the multilayered substrate 100) at a stage where the growth process of the GaN layer 20 is performed by the manufacturing apparatus 200, and specifically is the underlying structure 10 when the growth of the GaN layer 20 starts and is a multilayered body of the underlying structure 10 and the GaN layer 20 after the growth of the GaN layer 20 starts.

The manufacturing apparatus 200 is a horizontal flow type MOVPE apparatus in which a source gas 220 is supplied in a direction parallel to the upper surface of the wafer 40. The source gas 220 includes GaN source gas for growing GaN constituting the GaN layer 20 and Si doping source gas for supplying Si to be added to the GaN layer 20. The GaN source gas includes gallium (Ga) source gas and nitrogen (N) source gas, and as the Ga source gas, for example, trimethyl gallium (TMG) gas is used, and as the N source gas, for example, ammonia ($NH_3$) gas is used. As the Si doping source gas, for example, silane ($SiH_4$) gas is used.

A growth temperature can be selected, for example, in a range of 900° C. to 1400° C., and the V/III ratio, which is the flow rate ratio of the group V source gas to the group III source gas, can be selected in a range of 10 to 5,000, for example. The Si doping source gas is supplied so that a target doping concentration in the GaN layer 20 is a specified value within a range of $4\times10^{15}$ cm$^{-3}$ or more and less than $2\times10^{16}$ cm$^{-3}$, for example, $9\times10^{15}$ cm$^{-3}$.

The susceptor 210 holds the wafer 40 so as to rotate the wafer 40 with the center of the wafer 40 as the center of rotation. By growing the GaN layer 20 while performing such a rotation, the growth conditions for the GaN layer 20 can be made uniform in the circumferential direction of the wafer 40.

A susceptor inner circumferential edge 211 is a position on the susceptor 210 where the edge of the wafer 40 is arranged in plan view. A susceptor edge upper surface 213 is an upper surface of the susceptor 210 between the susceptor inner circumferential edge 211 and a susceptor outer circumferential edge 212.

During the growth process of the GaN layer 20, Si is mixed into the GaN layer 20 from the Si-containing deposition 230, due to the deposition of the Si-containing deposition 230 on the susceptor edge upper surface 213. The containing Si in the GaN layer 20 resulting from the Si-containing deposition 230 is called a "contamination" (mixing), and is distinguished from "doping" (adding) which is intentionally causing the GaN layer 20 to contain Si using the Si-doping source gas. The Si concentration in the top surface 25 of the GaN layer 20 is the sum of the Si concentration added by the Si doping source gas and the mixed Si concentration resulting from the Si-containing deposition 230.

The concentration of Si added by the Si doping source gas is schematically constant over an entire top surface 25 of the GaN layer 20. The concentration of the mixed Si resulting from the Si-containing deposition 230 becomes higher at a position closer to the inner circumferential edge 211 of the susceptor, that is, closer to the outer circumferential side of the wafer 40.

Figure 8:
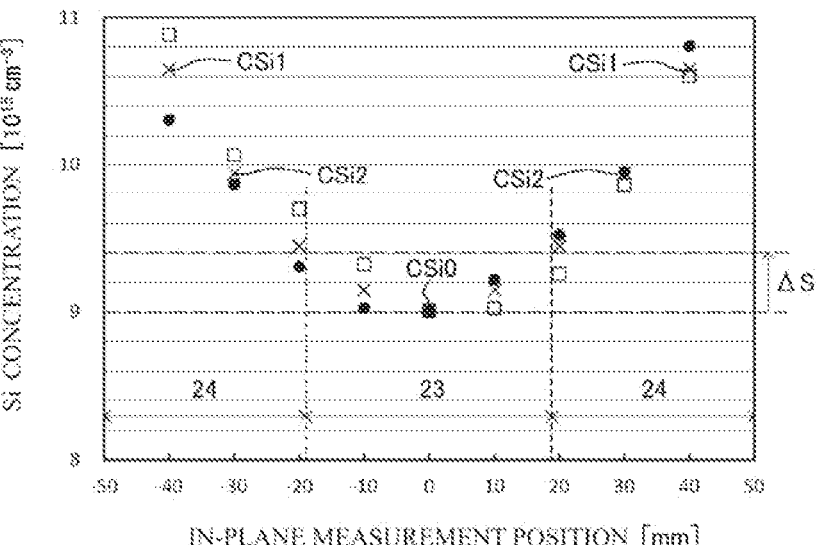
FIG. 8 is a graph showing an example of the Si concentration distribution in the top surface of the GaN layer according to a comparative embodiment.

FIG. 8 is a graph showing one example of the Si concentration distribution in the top surface 25 of the GaN layer 20 according to a comparative embodiment. The horizontal axis shows the in-plane measurement position in units of mm, and the vertical axis shows the Si concentration in units of $10^{15}$ cm$^{-3}$. The Si concentration at each measurement point in the X direction is indicated by a black circle, and the Si concentration at each measurement point in the Y direction is indicated by an open square. An average Si concentration is indicated by a cross.

Here, as a comparative embodiment, explanation is given for an embodiment based on the assumption that adding C, which is an embodiment described below, is not performed. Therefore, the comparative embodiment is the same as the embodiment except that C is not added, and the Si concentration distribution illustrated in FIG. 8 is the same between the comparative embodiment and the embodiment.

The central Si concentration CSi0 is $9.01 \times 10^{15}$ cm$^{-3}$, which is approximately equal to a target doping concentration of $9 \times 10^{15}$ cm$^{-3}$, and the Si concentration is almost constant up to about 10 mm from the center. From this reason, it can be said that the contamination of Si has not reached the center of the wafer 40.

At a radial position that is about 20 mm or more away from the center, the concentration of the mixed Si, which is the excess from the central Si concentration CSi0, increases significantly. Further, the concentration of the mixed Si increases toward the outer circumference. The outer circumferential Si concentration CSi1 is $10.65 \times 10^{15}$ cm$^{-3}$, and the outer circumferential Si contamination concentration, which is the excess of the outer circumferential Si concentration CSi1 from the central Si concentration CSi0, is $1.64 \times 10^{15}$ cm$^{-3}$.

Si resulting from the Si-containing deposition 230 is mixed from the edge of the wafer 40 up to a width of about 40 mm in a radial direction. In the wafer 40 of this example having a large diameter, for example, a radius of 50 mm, as in this example, contamination of Si does not occur at the center. In contrast, when assuming an embodiment using a wafer with a smaller diameter, for example, a radius of 25 mm, contamination of Si will occur in even at the center of the wafer.

In a small-diameter embodiment to cause contamination of Si at the center, the Si mixed from both edges sandwiching the center is superimposed at the center. Therefore the Si concentration resulting from the mixed Si becomes high also at the center. As a result, the Si concentration distribution resulting from the mixed Si approaches in-plane uniformity.

In contrast, as in the case of this example, in a large-diameter embodiment that avoid the contamination of Si at the center, the Si concentration distribution resulting from the mixed Si becomes a non-uniform distribution with a large difference between the center and the outer circumference. As described above, in the wafer 40 with a large diameter, specifically, a radius of 50 mm or more, the in-plane non-uniformity of the Si concentration distribution resulting from the mixed Si becomes significant.

Although 50 mm radius embodiment is shown, even in the wafer 40 with a radius of more than 50 mm, the concentration of mixed Si at the outer circumference (a radial position 10 mm from the edge of the wafer 40, and a radial position 10 mm from the susceptor inner circumferential edge 211 in the comparative embodiment) is approximately the same as in the case of a radius of 50 mm.

The outer circumferential Si contamination concentration, which is a difference of the Si concentration between the center and the outer circumference, is $1.64 \times 10^{15}$ cm$^{-3}$. On the other hand, a target Si doping concentration, that is, the central Si concentration CSi0, is such a low concentration that is affected by $10^{15}$ cm$^{-3}$ order fluctuation of concentration. Therefore, the influence of the outer circumferential Si contamination concentration in the in-plane Si concentration distribution becomes significant.

As described above, in the GaN layer 20 where the radius of the top surface 25 is 50 mm or more and the central Si concentration CSi0 is $4 \times 10^{15}$ cm$^{-3}$ or more and less than $2 \times 10^{16}$ cm$^{-3}$ (and even less than $1 \times 10^{16}$ cm$^{-3}$), the difference in Si concentration between the center and the outer circumference becomes significant resulting from the mixed Si. In other words, due to such a difference in the Si concentration, the difference in n-type carrier concentration between the center and the outer circumference becomes significant. As described below, the embodiments propose a technique that can suppress such a difference in n-type carrier concentration between the center and the outer circumference compared to comparative embodiments.

The embodiment will be further described. As described above, FIG. 8 is also a graph showing the Si concentration distribution in the top surface 25 of the GaN layer 20 according to the embodiment. The Si concentration distribution will continue to be explained.

$0.4 \times 10^{15}$ cm$^{-3}$, which is the Si concentration that exceeds by 10% the lower limit of the target doping concentration, that is, $4 \times 10^{15}$ cm$^{-3}$, which is the lower limit of the central Si concentration CSi0, is defined as a contamination reference value $\Delta$Si. A region where the concentration of the mixed Si is less than or equal to the Si contamination reference value $\Delta$Si, is referred to as a low Si contamination concentration region 23. A region where the concentration of the mixed Si exceeds the contamination reference value $\Delta$Si, is referred to as a high Si contamination concentration region 24.

The high Si contamination concentration region 24 is an annular region on the edge side of the top surface 25 of the GaN layer 20. (An entire area of) the circular region inside the annular region which is the high Si contamination concentration region 24, is the low Si contamination concentration region 23. The width of the annular region serving as the high Si contamination concentration region 24 from the edge of the top surface 25, is approximately 30 mm.

The high Si contamination concentration region 24 is a region where the excess n-type carrier concentration resulting from the mixed Si is large. In the embodiment, by adding C to the high Si contamination concentration region 24 to compensate for at least part of the excess n-type carrier concentration, the difference in n-type carrier concentration between the center and the outer circumference is suppressed.

Figure 3:
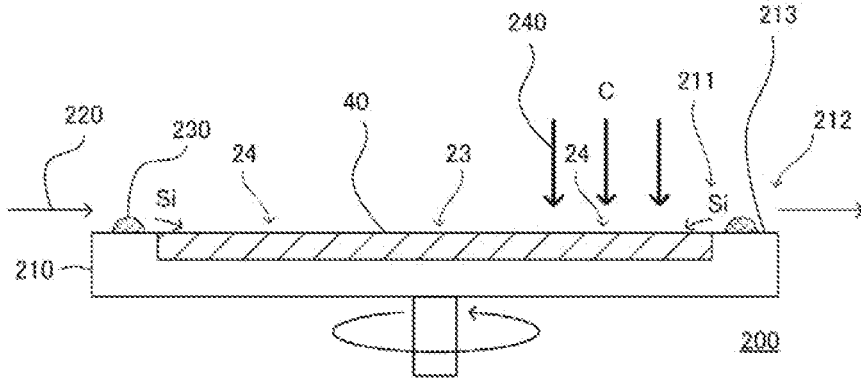
FIG. 3 is a schematic side view illustrating an apparatus for manufacturing the GaN layer according to an embodiment.

FIG. 3 is a schematic side view illustrating an apparatus 200 for manufacturing the GaN layer 20 according to an embodiment. Similarly to the comparative embodiment, the manufacturing apparatus 200 according to the embodiment is a horizontal flow type MOVPE apparatus, and the main source gas 220 (GaN source gas and Si doping source gas) is supplied in a direction parallel to the upper surface of the wafer 40.

The manufacturing apparatus 200 according to the embodiment further includes a mechanism for supplying a compensation source gas 240. The compensation source gas 240 includes a C-doping source gas for supplying C added to the GaN layer 20. For example, methane ($CH_4$) gas is used as the C-doping source gas.

Since the Ga source gas (for example, TMG gas) contained in the main source gas 220 is an organic source gas, C resulting from the Ga source gas will also be contained in the GaN layer 20. Containing C in the GaN layer 20 resulting from the Ga source gas is called "contamination," (mixing) and is distinguished from "addition," (doping) which is intentionally causing the GaN layer 20 to contain C using the C-doping source gas. The C concentration in the top surface of the GaN layer 20 is the sum of the concentration of C added by the C-doping source gas and the concentration of the mixed C resulting from the Ga source gas.

The concentration of the mixed C resulting from the Ga source gas is schematically constant over an entire top surface 25 of the GaN layer 20. The compensation source gas 240, that is, the C-doping source gas, is selectively supplied to the high Si contamination concentration region 24.

In the embodiment, in order to preferentially add C to the high Si contamination concentration region 24, the C-doping source gas is selectively supplied to the high Si contamination concentration region 24, that is, to a predetermined range on the outer circumferential side in a radial direction (specifically, in this example, a range approximately 30 mm wide from the edge of the top surface 25). Since the Si concentration is slightly higher also in the outer circumference side portion in the low Si contamination concentration region 23, the C-doping source gas may be supplementarily supplied to this portion.

The C-doping source gas is supplied from a direction perpendicular to the upper surface of the wafer 40. Specifically, on the downstream side of the main source gas 220 with respect to a rotation center of the wafer 40, the C-doping source gas is supplied onto the high Si contamination concentration region 24 from a vertical direction. This enables selective supply to the high Si contamination concentration region 24.

The concentration of the mixed Si in the high Si contamination concentration region 24 is higher toward the outer circumference. Therefore, it is preferable that the C-doping source gas is supplied to a plurality of positions in the radial direction in the high Si contamination concentration region 24, and preferable that a supply amount of the C-doping source gas supplied to a plurality of positions in the radial direction is controlled so that the amount becomes larger toward the outer circumference.

The growth conditions for the GaN layer 20 of the embodiment are the same as those of the comparative embodiment except for the supply conditions for the C-doping source gas. The conditions for supplying the C-doping source gas (the supply position, supply amount, supply timing, etc., of the C-doping source gas) may be appropriately set based on experimental studies, to compensate for the excess n-type carrier concentration resulting from the mixed Si. A rough guideline is to set the conditions for supplying the C-doping source gas so that the concentration of the mixed Si and the concentration of the added C are equal at each position in a radial direction. However, since it is not easy to judge how much of the added C compensates for the n-type carrier, the concentration of the added C may be adjusted as appropriate.

By adding C, an effect of compensating for at least part of the excess n-type carrier concentration can be obtained compared to a comparative embodiment in which C is not added. Therefore, it is not essential to add C to completely compensate for the excess n-type carrier concentration.

For example, it is not essential that the concentration of C added to the outer circumference is as high as (or higher than) the concentration of the Si mixed in the outer circumference. However, it is preferable that the concentration of C added to the outer circumference is 0.5 times or more the concentration of the Si mixed in the outer circumference. In order to prevent the outer circumferential C-doping concentration from becoming excessive, the outer circumferential C-doping concentration is preferably twice or less than the outer circumferential Si contamination concentration.

The concentration of the mixed C resulting from the Ga source gas, that is, the central C concentration CC0, is, for example, about $2 \times 10^{15}$ $cm^{-3}$ as described later, but it may be a value different from this value. However, it is preferable that the central C concentration CC0 be as low as possible so that it is below the lower limit of the central Si concentration CSi0. The concentration of the added C is an excess from the central C concentration CC0, and such an excess C concentration contributes to the effect of compensating for the excess n-type carrier concentration in the embodiment.

Figure 4:
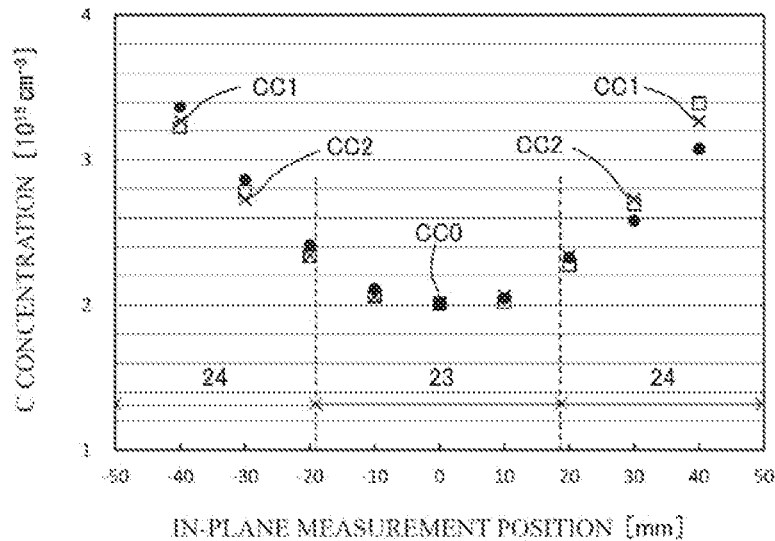
FIG. 4 is a graph showing an example of a C concentration distribution in the top surface of the GaN layer according to an embodiment.

FIG. 4 is a graph showing an example of the C concentration distribution in the top surface 25 of the GaN layer 20 according to the embodiment. The horizontal axis shows the in-plane measurement position in units of mm, and the vertical axis shows the C concentration in units of $10^{15}$ $cm^{-3}$, and the C concentration at each measurement point in the X direction is indicated by a black circle, and the C concentration at each measurement point in the Y direction is indicated by an open square. The average C concentration is indicated by a cross.

The central C concentration CC0 is $2.01 \times 10^{15}$ $cm^{-3}$. In the high Si contamination concentration region 24, the C concentration is higher than the central C concentration CC0, that is, C is added. Corresponding to the higher concentration of the mixed Si toward the outer circumference, C is added such that the concentration of the added C becomes higher toward the outer circumference. The outer circumferential C concentration CC1 is $3.26 \times 10^{15}$ $cm^{-3}$, and the outer circumferential C-doping concentration, which is the excess of the outer circumferential C concentration CC1 from the center C concentration CC0, is $1.25 \times 10^{15}$ $cm^{-3}$. The outer circumferential C-doping concentration of $1.25 \times 10^{15}$ $cm^{-3}$ is 0.76 times the outer circumferential Si contamination concentration of $1.64 \times 10^{15}$ $cm^{-3}$.

Further, features related to a height direction (depth direction, thickness direction) of C addition according to the embodiment will be described below. The concentration of the Si mixed into the GaN layer 20 generally tends to increase as the GaN layer 20 becomes thicker. This is because more Si-containing deposition 230 adheres on the susceptor edge upper surface 213 as the growth time of the GaN layer 20 increases. Therefore, the supply of the C-doping source gas may be started at a timing when the growth thickness of the mixed Si reaches a predetermined concentration or higher.

Figure 5:
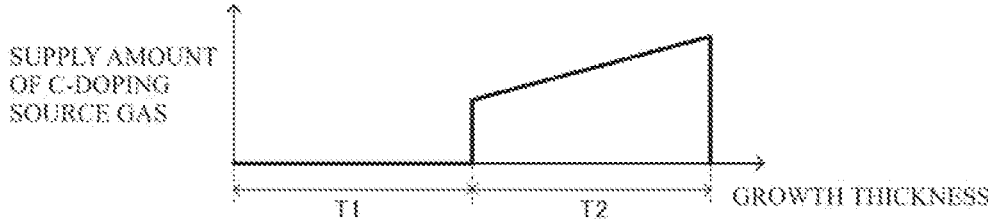
FIG. 5 is a timing chart schematically showing how C-doping source gas is supplied at a representative position on a circumference.

FIG. 5 is a timing chart schematically showing a supply mode of the C-doping source gas at a representative position on the outer circumference (a radial position 10 mm from the edge). The horizontal axis indicates the growth thickness of the GaN layer 20, and the vertical axis indicates the supply amount of the C-doping source gas. The supply of the C-doping source gas is started at a timing when the outer circumferential Si contamination concentration reaches a growth thickness T1 at which the concentration reaches a predetermined concentration, for example, reaches the above-describe contamination reference value ΔSi ($0.4 \times 10^{15}$ cm$^{-3}$). Thereafter, the concentration of Si mixed into the outer circumference increases until it reaches a final growth thickness T2 of the GaN layer 20. Therefore, preferably, the supply amount of the C-doping source gas is increased as the growth thickness becomes thicker so as to correspond to the increase in the outer circumferential Si contamination concentration.

On the center side of the representative position on the outer circumference, there is less mixed Si than at the representative position on the outer circumference. Therefore, the supply start timing of the C-doping source gas may be delayed on the center side, compared to the start timing at the representative position on the outer circumference. Further, there is more mixed Si on the outer circumference side (edge side) than at the representative position on the outer circumference. Therefore, on the outer circumference side (edge side), the supply start timing of the C-doping source gas may be set earlier than at the representative position on the outer circumference. Even on the center side or further on the outer circumference (edge side) than the representative position on the outer circumference, the supply amount of the C-doping source gas may be increased as the growth thickness becomes thicker so as to correspond to the increase in the concentration of the mixed Si.

Figure 6:
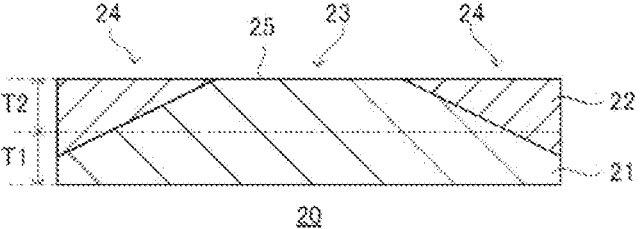
FIG. 6 is a schematic cross-sectional view illustrating a GaN layer according to an embodiment.

FIG. 6 is a schematic cross-sectional view illustrating the GaN layer 20 according to an embodiment. A region to which the C-doping source gas is not supplied is a C-non-added region 21, and a region to which the C-doping source gas is supplied is a C-added region 22. Hereinafter, the representative position on the outer circumference (a radial position 10 mm from the edge) will be explained as an example. A range of the thickness T2 below from the top surface 25 of the GaN layer 20 is a C-doped region 22, and a range of the thickness T1 below from the lower edge of the C-doped region 22 is a C-undoped region 21.

In the C-doped region 22, the C concentration is highest in the top surface 25, and decreases downward from the top surface 25. Further, the C concentration in the C-undoped region 21 is lower than the C concentration in the top surface 25. That is, in the GaN layer 20, at a predetermined depth position from the top surface 25 at a representative position on the outer circumference (a radial position 10 mm from the edge), there is a region where the C concentration is lower than the outer circumferential C concentration in the top surface 25.

Further, as described above, the concentration of Si mixed into the GaN layer 20 generally tends to increase as the GaN layer 20 becomes thicker. In other words, the concentration of the mixed Si in the GaN layer 20 generally tends to be lower toward the lower side of the GaN layer 20. That is, in the GaN layer 20, at a predetermined depth position from the top surface 25 at a representative position on the outer circumference (a radial position 10 mm from the edge), there is a region having a lower Si concentration than the outer circumferential Si concentration in the top surface 25.

Hereinafter, the characteristics of the GaN layer 20 according to the embodiment will be further explained. The concentration of the mixed Si schematically decreases monotonically from the outer circumference of the GaN layer 20 toward the center. Therefore, the GaN layer 20 of the embodiment is characterized in that an intermediate Si concentration CSi2 at a radial position between the center and the outer circumference is higher than the central Si concentration CSi0 and lower than the outer circumferential Si concentration CSi1.

The intermediate Si concentration CSi2 is, for example, the average Si concentration at a radial position 30 mm from the center. In the example illustrated in FIG. 8, the intermediate Si concentration CSi2 ($9.94 \times 10^{15}$ cm$^{-3}$) is higher than the central Si concentration CSi0 ($9.01 \times 10^{15}$ cm$^{-3}$), and lower than the outer circumferential Si concentration CSi1 ($10.65 \times 10^{15}$ cm$^{-3}$).

In order to correspond to a concentration distribution shape of the mixed Si, the concentration of the added C is also preferably decreased monotonically from the outer circumference side to the center side of the GaN layer 20. That is, the GaN layer 20 of the embodiment preferably has a feature that the intermediate C concentration CC2 at a radial position between the center and the outer circumference is higher than the central C concentration CC0 and lower than the outer circumferential C concentration CC1.

The intermediate C concentration CC2 is, for example, the average C concentration at a radial position 30 mm from the center. In the example shown in FIG. 4, the intermediate C concentration CC2 ($2.73 \times 10^{15}$ cm$^{-3}$) is higher than the central C concentration CC0 ($2.01 \times 10^{15}$ cm$^{-3}$) and lower than the outer circumferential C concentration CC1 ($3.26 \times 10^{15}$ cm$^{-3}$).

Preferable Aspects of the Present Invention

Hereinafter, preferable aspects of the present invention will be supplementarily described.

Supplementary Description 1

A multilayered substrate, including:
an underlying substrate; and
  a gallium nitride layer epitaxially grown above the underlying substrate and comprising gallium nitride doped with silicon;
  the gallium nitride layer having a top surface with a radius of 50 mm or more,
  the gallium nitride layer having a thickness of 4 m or more,
  wherein a silicon concentration in the top surface of the gallium nitride layer has a distribution in which an outer circumferential silicon concentration at a radial position 10 mm from an edge of the top surface is higher than a central silicon concentration at a center of the top surface,
  the central silicon concentration is $4 \times 10^{15}$ cm$^{-3}$ or more and less than $2 \times 10^{16}$ cm$^{-3}$, and
  a carbon concentration in the top surface of the gallium nitride layer has a distribution in which an outer circumferential carbon concentration at a radial position 10 mm from an edge of the top surface is higher than a central carbon concentration at a center of the top surface.

Supplementary Description 2

The multilayered substrate according to supplementary description 1, wherein in the gallium nitride layer, at a predetermined depth position from the top surface at a radial position of 10 mm from the edge of the top surface, there is a region where a carbon concentration is lower than the outer circumferential carbon concentration in the top surface.

Supplementary Description 3

The multilayered substrate according to supplementary description 1 or 2, wherein in the gallium nitride layer, at a predetermined depth position from the top surface at a radial position of 10 mm from an edge of the top surface, there is a region where a silicon concentration is lower than the outer circumferential silicon concentration in the top surface.

Supplementary Description 4

The multilayered substrate according to supplementary descriptions 1 to 3, wherein the silicon concentration in the top surface of the gallium nitride layer has a distribution in which an intermediate silicon concentration at a radial position 30 mm from a center of the top surface is higher than the central silicon concentration and lower than the outer circumferential silicon concentration.

Supplementary Description 5

The multilayered substrate according to supplementary descriptions 1 to 4, wherein a carbon concentration in the top surface of the gallium nitride layer has a distribution in which an intermediate carbon concentration at a radial position 30 mm from a center of the top surface is higher than the central carbon concentration and lower than the outer circumferential carbon concentration.

What is claimed is:

1. A multilayered substrate, comprising:

an underlying substrate; and a gallium nitride layer epitaxially grown above the underlying substrate and comprising gallium nitride doped with silicon;

the gallium nitride layer having a top surface with a radius of 50 mm or more, the gallium nitride layer having a thickness of 4 m or more, wherein a silicon concentration in the top surface of the gallium nitride layer has a distribution in which an outer circumferential silicon concentration at a radial position 10 mm from an edge of the top surface is higher than a central silicon concentration at a center of the top surface, the central silicon concentration is $4 \times 10^{15}$ cm$^{-3}$ or more and less than $2 \times 10^{16}$ cm$^{-3}$, and a carbon concentration in the top surface of the gallium nitride layer has a distribution in which an outer circumferential carbon concentration at a radial position 10 mm from an edge of the top surface is higher than a central carbon concentration at a center of the top surface.

2. The multilayered substrate according to claim 1, wherein in the gallium nitride layer, at a predetermined depth position from the top surface at a radial position of 10 mm from the edge of the top surface, there is a region where a carbon concentration is lower than the outer circumferential carbon concentration in the top surface.

3. The multilayered substrate according to claim 1, wherein in the gallium nitride layer, at a predetermined depth position from the top surface at a radial position of 10 mm from an edge of the top surface, there is a region where a silicon concentration is lower than the outer circumferential silicon concentration in the top surface.

4. The multilayered substrate according to claim 1, wherein the silicon concentration in the top surface of the gallium nitride layer has a distribution in which an intermediate silicon concentration at a radial position 30 mm from a center of the top surface is higher than the central silicon concentration and lower than the outer circumferential silicon concentration.

5. The multilayered substrate according to claim 1, wherein a carbon concentration in the top surface of the gallium nitride layer has a distribution in which an intermediate carbon concentration at a radial position 30 mm from a center of the top surface is higher than the central carbon concentration and lower than the outer circumferential carbon concentration.

* * * * *